(12) United States Patent
Park et al.

(10) Patent No.: US 11,804,459 B2
(45) Date of Patent: Oct. 31, 2023

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Jinho Park, Seoul (KR); Chin Kim, Seongnam-si (KR); Yongseung Bang, Suwon-si (KR); Jiyeon Baek, Yongin-si (KR); Jeong Hoon Ahn, Seongnam-si (KR)

(73) Assignee: Samsung Electronics Co., Ltd.

( * ) Notice: Subject to any disclaimer, the term of this patent is extended or adjusted under 35 U.S.C. 154(b) by 380 days.

(21) Appl. No.: 17/009,975

(22) Filed: Sep. 2, 2020

(65) Prior Publication Data

US 2021/0242147 A1 Aug. 5, 2021

(30) Foreign Application Priority Data

Jan. 31, 2020 (KR) ........................ 10-2020-0012110

(51) Int. Cl.
*H01L 23/00* (2006.01)
*H01L 23/522* (2006.01)
*H01L 23/532* (2006.01)

(52) U.S. Cl.
CPC .......... *H01L 24/05* (2013.01); *H01L 23/5226* (2013.01); *H01L 24/03* (2013.01);
(Continued)

(58) Field of Classification Search
CPC ..... H01L 24/05; H01L 23/5226; H01L 24/03; H01L 24/13; H01L 23/53238; H01L 2224/05018; H01L 2224/05025; H01L 2224/05083; H01L 2224/05166; H01L 2224/05181; H01L 2224/05184; H01L 2224/05186; H01L 2224/05547; H01L 2224/05561; H01L 2224/05572; H01L 2224/05624; H01L 2224/05686; H01L 2224/13026; H01L 2224/02166;
(Continued)

(56) References Cited

U.S. PATENT DOCUMENTS 6,472,304 B2 10/2002 Chittipeddi et al.
6,614,091 B1 9/2003 Downey et al.
(Continued)

FOREIGN PATENT DOCUMENTS

KR 10-0640947 B1 11/2006

*Primary Examiner* — Jonathan Han
(74) *Attorney, Agent, or Firm* — Fish & Richardson P.C.

(57) ABSTRACT

Disclosed are semiconductor devices and methods of fabricating the same. The semiconductor device includes a first dielectric layer including a first pad, a second dielectric layer on the first dielectric layer, a through electrode that penetrates the second dielectric layer and is electrically connected to the first pad, an upper passivation layer on the second dielectric layer, a second pad on the upper passivation layer, and an upper barrier layer between the upper passivation layer and the second pad. The first pad and the through electrode include a first material. The second pad includes a second material that is different from the first material of the first pad and the through electrode. The second pad includes a first part on the upper passivation layer, and a second part that extends from the first part into the upper passivation layer and is connected to the through electrode.

15 Claims, 10 Drawing Sheets

(52) U.S. Cl.
CPC ........ *H01L 24/13* (2013.01); *H01L 23/53238* (2013.01); *H01L 2224/05018* (2013.01); *H01L 2224/05025* (2013.01); *H01L 2224/05083* (2013.01); *H01L 2224/05166* (2013.01); *H01L 2224/05181* (2013.01); *H01L 2224/05184* (2013.01); *H01L 2224/05186* (2013.01); *H01L 2224/05547* (2013.01); *H01L 2224/05561* (2013.01); *H01L 2224/05572* (2013.01); *H01L 2224/05624* (2013.01); *H01L 2224/05686* (2013.01); *H01L 2224/13026* (2013.01)

(58) Field of Classification Search
CPC ... H01L 2224/0401; H01L 2224/05027; H01L 2224/05084; H01L 2224/05124; H01L 2224/05147; H01L 2224/05666; H01L 2224/05681; H01L 2224/05684; H01L 2224/131; H01L 23/53223; H01L 24/11; H01L 23/53228; H01L 23/481; H01L 23/485; H01L 23/528; H01L 24/06

See application file for complete search history.

(56) References Cited

U.S. PATENT DOCUMENTS

| | | |
|---|---|---|
| 6,794,752 B2 | 9/2004 | Lee et al. |
| 6,960,831 B2 | 11/2005 | Burrell et al. |
| 7,030,481 B2 | 4/2006 | Chudzik et al. |
| 7,453,128 B2 | 11/2008 | Tsutsue et al. |
| 2013/0175673 A1* | 7/2013 | Jin ................. H01L 23/481 257/621 |
| 2015/0287683 A1* | 10/2015 | Moon .............. H01L 23/544 257/621 |
| 2016/0086874 A1* | 3/2016 | Choi ............ H01L 21/76898 257/774 |
| 2019/0027450 A1* | 1/2019 | Choi ................. H01L 24/16 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0012110 filed on Jan. 31, 2020 in the Korean Intellectual Property Office, the disclosure of which is hereby incorporated by reference in its entirety.

BACKGROUND

The present inventive concepts relate to a semiconductor device and a method of fabricating the same.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly designed with higher integration due to advances in the electronic industry. For example, there has been a greater need to semiconductor devices to provide higher reliability, higher speed, and/or multi-functionality. Semiconductor devices have gradually become more complicated and more integrated to meet these characteristics.

SUMMARY

Some example embodiments of the present inventive concepts provide a semiconductor device with reduced misalignment of pads and decreased occurrence of voids in vias.

Some example embodiments of the present inventive concepts provide a method of fabricating a semiconductor device with reduced misalignment of pads and decreased occurrence of voids in vias.

According to some example embodiments of the present inventive concepts, a semiconductor device may include a first dielectric layer that includes a first pad, a second dielectric layer on the first dielectric layer, a through electrode that penetrates the second dielectric layer and is electrically connected to the first pad, an upper passivation layer on the second dielectric layer, a second pad on the upper passivation layer, and an upper barrier layer between the upper passivation layer and the second pad. The first pad and the through electrode may include a first material. The second pad may include a second material different from the first material of the first pad and the through electrode. The second pad may include a first part on the upper passivation layer; and a second part that extends from the first part into the upper passivation layer and is electrically connected to the through electrode. The upper barrier layer may be between the upper passivation layer and a bottom surface of the first part. The upper barrier layer may extend between the upper passivation layer and a lateral surface of the second part of the second pad and between the through electrode and a bottom surface of the second part of the second pad.

According to some example embodiments of the present inventive concepts, a semiconductor device may include a first dielectric layer that includes a first pad, a second dielectric layer on the first dielectric layer, a through electrode that penetrates the second dielectric layer and is connected to the first pad, an upper passivation layer on the second dielectric layer, a second pad on the upper passivation layer, and a solder ball on the second pad. The second pad may include a first part on the upper passivation layer; and a second part that extends from the first part into the upper passivation layer and is electrically connected to the through electrode. The solder ball may be on the first part of the second pad.

According to some example embodiments of the present inventive concepts, a method of fabricating a semiconductor device may include providing a first dielectric layer that includes a first pad, forming a second dielectric layer on the first dielectric layer, removing a portion of the second dielectric layer to form a via hole, forming in the via hole a through electrode electrically connected to the first pad, forming an upper passivation layer on the second dielectric layer, forming a recess region in the upper passivation layer, forming an upper barrier layer on an inner surface of the recess region, and forming a second pad on the upper barrier layer.

According to some example embodiments of the present inventive concepts, a semiconductor device includes a first dielectric layer comprising a first pad that includes a first material, a second dielectric layer on the first dielectric layer, a through electrode that penetrates the second dielectric layer and is electrically connected to the first pad, an upper passivation layer on the second dielectric layer, a second pad on the upper passivation layer, and an upper barrier layer between the upper passivation layer and the second pad. The through electrode includes the first material. The second pad includes a second material different from the first material of the first pad and the through electrode. The second pad does not include the first material.

DETAILED DESCRIPTION OF EMBODIMENTS

The following will now describe a semiconductor device according to some example embodiments of the present inventive concepts in conjunction with the accompanying drawings.

Figure 1:
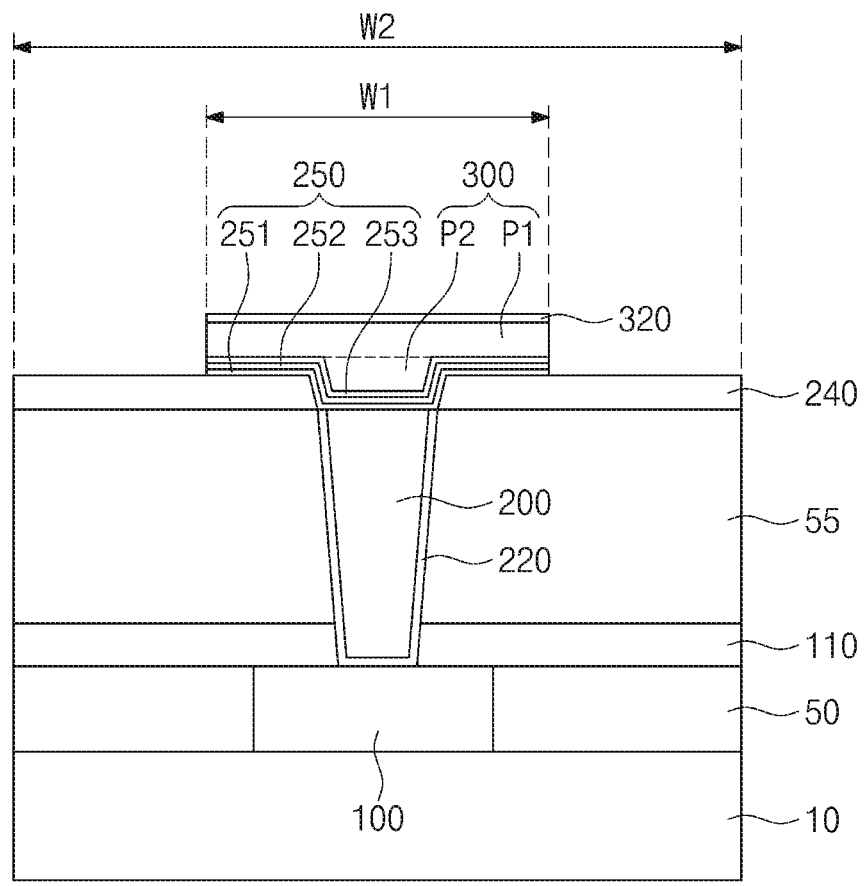
FIG. 1 illustrates a simplified cross-sectional view showing a semiconductor device according to some example embodiments of the present inventive concepts.

FIG. 1 illustrates a simplified cross-sectional view showing a semiconductor device according to some example embodiments of the present inventive concepts.

Referring to FIG. 1, a semiconductor device according to some example embodiments of the present inventive concepts may include a first pad 100, a first dielectric layer 50, a lower passivation layer 110, a lower barrier layer 220, a through electrode 200, a second dielectric layer 55, an upper passivation layer 240, an upper barrier layer 250, a second pad 300, and a first protective layer 320.

The first dielectric layer 50 may include the first pad 100. A lower structure 10 may include a plurality of conductive patterns (not shown) and a plurality of transistors (not shown). The first pad 100 may be electrically connected to at least one selected from the plurality of conductive patterns and transistors in the lower structure 10. The lower passivation layer 110, the second dielectric layer 55, and the upper passivation layer 240 may be sequentially stacked on the first dielectric layer 50. The first pad 100 may include a conductive material.

The through electrode 200 may penetrate the second dielectric layer 55 and the lower passivation layer 110, and may have electrical connection with the first pad 100. A width at an upper portion of the through electrode 200 may be greater than a width at a lower portion of the through electrode 200. The lower barrier layer 220 may be interposed between the through electrode 200 and the second dielectric layer 55 and between the through electrode 200 and the lower passivation layer 110, and may extend between the lower barrier layer 220 and the first pad 100. The through electrode 200 may include a conductive material. The lower barrier layer 220 may include a conductive material, such as conductive metal nitride. For example, the lower barrier layer 220 may include one or more of Ti, Ta, TaN, TiN, TiSiN, W, WN, WC, and WCN.

The second pad 300 may be disposed on the upper passivation layer 240. The upper barrier layer 250 may be disposed between the upper passivation layer 240 and the second pad 300. The second pad 300 may include a first part P1 on the upper passivation layer 240, and may also include a second part P2 that extends from the first part P1 toward or into the upper passivation layer 240 and is electrically connected to the through electrode 200. A width at an upper portion of the second part P2 may be greater than a width at a lower portion of the second part P2. The second pad 300 may include a conductive material.

The first pad 100 may include the same material as that of the through electrode 200, and the second pad 300 may include a different material from that of the first pad 100 and the through electrode 200. For example, the first pad 100 may include copper (Cu), and the second pad 300 may include aluminum (Al). The through electrode 200 may include copper (Cu).

The upper barrier layer 250 may be disposed between the upper passivation layer 240 and a bottom surface of the first part P1 and between the upper passivation layer 240 and a lateral surface of the second part P2, and may extend between the through electrode 200 and a bottom surface of the second part P2.

The upper barrier layer 250 may include a conductive material, such as conductive metal nitride. For example, the upper barrier layer 250 may include one or more of Ti, Ta, TaN, TiN, TiSiN, W, WN, WC, and WCN.

The upper barrier layer 250 may include a first upper barrier layer 251 adjacent to the upper passivation layer 240, a second upper barrier layer 252 on the first upper barrier layer 251, and a third upper barrier layer 253 adjacent to the second pad 300. The third upper barrier layer 253 may include a different material from that of the first upper barrier layer 251 and that of the second upper barrier layer 252.

The first upper barrier layer 251 may include a conductive material, such as conductive metal nitride. For example, the first upper barrier layer 251 may include one or more of Ti, Ta, TaN, TiN, TiSiN, W, WN, WC, and WCN.

The second upper barrier layer 252 may include a conductive material, such as conductive metal nitride. For example, the second upper barrier layer 252 may include one or more of Ti, Ta, TaN, TiN, TiSiN, W, WN, WC, and WCN.

The third upper barrier layer 253 may include a conductive material, such as conductive metal nitride. For example, the third upper barrier layer 253 may include one or more of Ti, Ta, TaN, TiN, TiSiN, W, WN, WC, and WCN. The through electrode 200 may be electrically connected to the first pad 100, and the second pad 300 may be electrically connected to the through electrode 200.

The first protective layer 320 may be disposed on a top surface of the first part P1 of the second pad 300. The third upper barrier layer 253 may include the same material as that of the first protective layer 320 on the top surface of the first part P1 of the second pad 300. The first protective layer 320 may include a conductive material, such as conductive metal nitride. For example, the first protective layer 320 may include one or more of Ti, Ta, TaN, TiN, TiSiN, W, WN, WC, and WCN.

The upper barrier layer 250, the second pad 300, and/or the first protective layer 320 may each have a width W1 less than a width W2 of the upper passivation layer 240. The term "width" may indicate a distance along a direction parallel to a top surface of a substrate (e.g., the lower structure 10).

The first dielectric layer 50 and the second dielectric layer 55 may each be an intermetal dielectric (IMD) layer, and may include silicon oxide, silicon nitride, polymer, or a combination thereof. For example, the first dielectric layer 50 and the second dielectric layer 55 may include one or more of tetraethylorthosilicate (TEOS), phosphosilicate glass (PSG), and undoped silicate glass (USG).

The upper passivation layer 240 and the lower passivation layer 110 may include silicon nitride, silicon oxide, or polyimide. For example, the upper passivation layer 240 and the lower passivation layer 110 may include one or more of SiN, SiC, SiCN, SiON, SiOC, and SiOCN.

FIGS. 2 to 13 illustrate cross-sectional views showing a method of fabricating a semiconductor device according to some example embodiments of the present inventive concepts.

Figure 2:
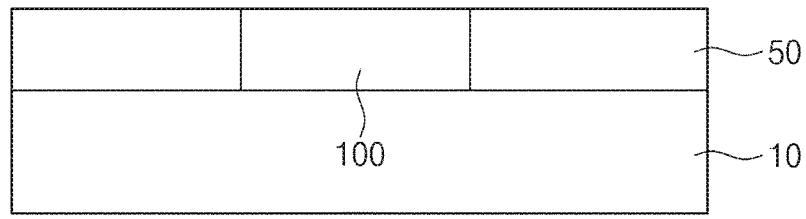
FIGS. 2 to 13 illustrate cross-sectional views showing a method of fabricating a semiconductor device according to some example embodiments of the present inventive concepts.

Referring to FIG. 2, a first dielectric layer 50 including a first pad 100 may be formed on a lower structure 10. The lower structure 10 may include a plurality of conductive patterns (not shown) and a plurality of transistors (not shown). The first pad 100 may be electrically connected to at least one of the plurality of conductive patterns and/or transistors.

Figure 3:
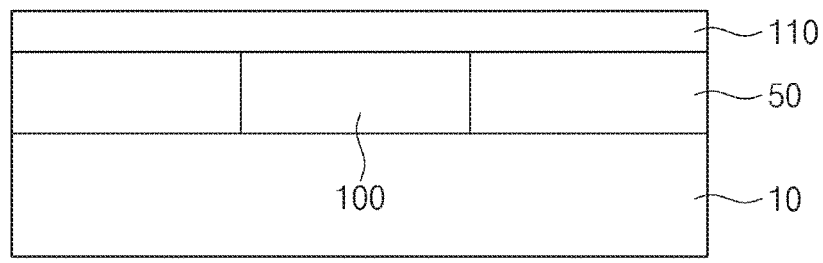

Referring to FIG. 3, a lower passivation layer 110 may be formed on the first dielectric layer 50. The lower passivation layer 110 may have a uniform thickness on the first dielectric layer 50. The lower passivation layer 110 may protect the first pad 100 and include a dielectric material. The formation of the lower passivation layer 110 may include performing a chemical vapor deposition process or an atomic layer deposition process.

Figure 4:
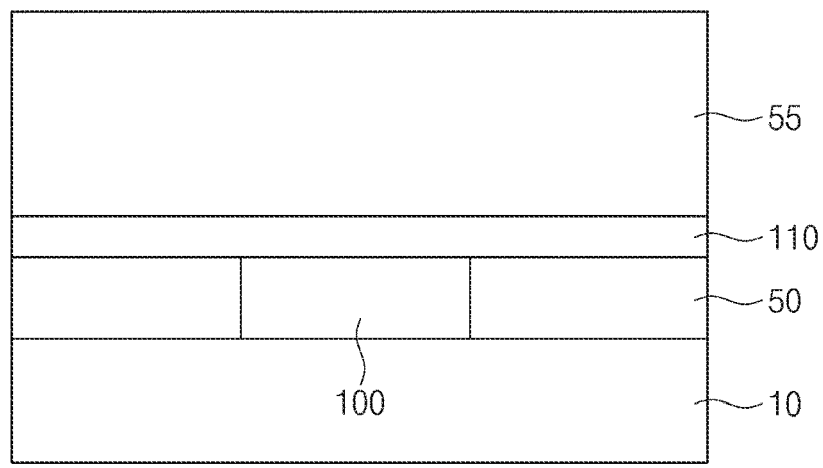

Referring to FIG. 4, a second dielectric layer 55 may be formed on the lower passivation layer 110. The formation of the second dielectric layer 55 may include performing a chemical vapor deposition process or an atomic layer deposition process.

Figure 5:
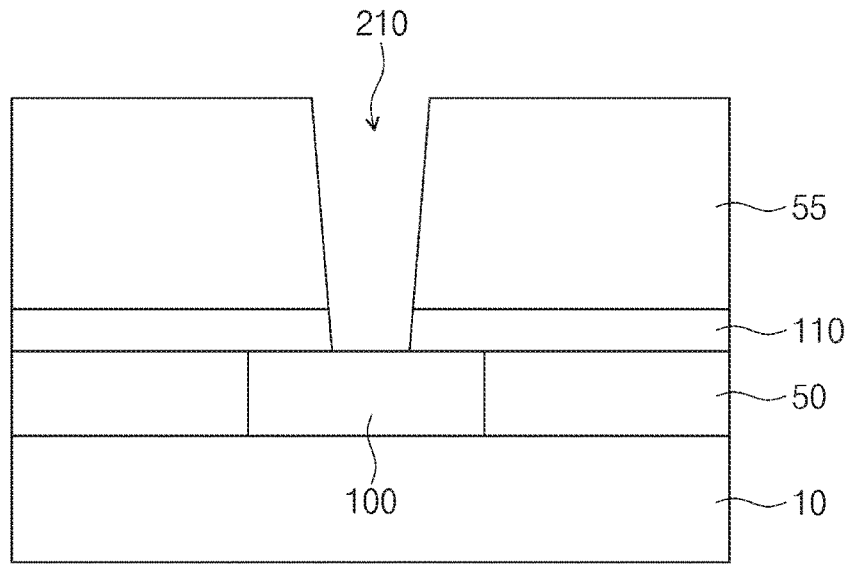

Referring to FIG. 5, a via hole 210 may be formed in the lower passivation layer 110. For example, the lower passivation layer 110 and the second dielectric layer 55 may be partially removed to form the via hole 210. The via hole 210 may expose the first pad 100. The via hole 210 may have a larger width at its upper portion and a smaller width at its lower portion. The via hole 210 may have slanted sidewalls with respect to the lower structure. The formation of the via hole 210 may include performing a dry etching process, a wet etching process, a laser drilling process, or a mechanical laser drilling process.

Figure 6:
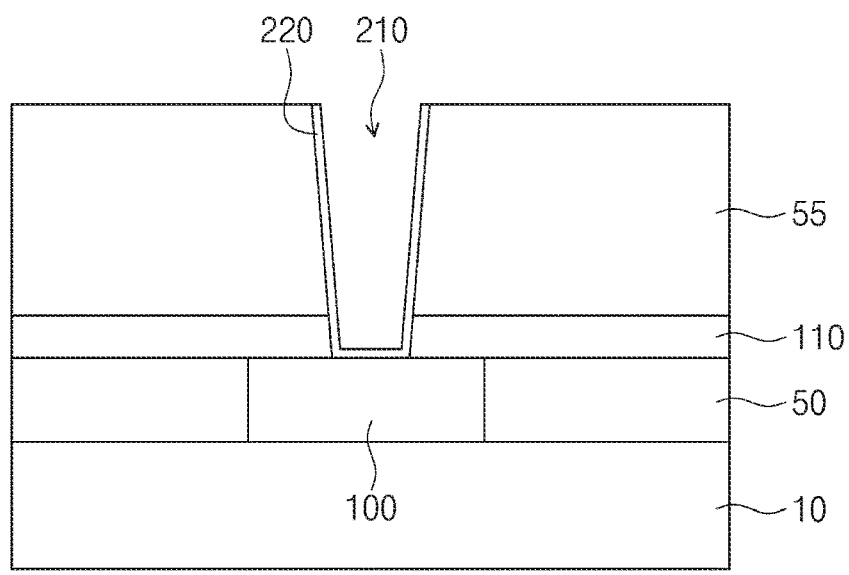

Referring to FIG. 6, a lower barrier layer 220 may be formed on an inner wall of the via hole 210. The lower barrier layer 220 may have a uniform thickness on a bottom surface and opposite lateral surfaces of the via hole 210. The lower barrier layer 220 may have slanted sidewalls with respect to the lower structure. The lower barrier layer 220 may be formed by a physical vapor deposition (PVD) process, a chemical vapor deposition (CVD) process, or an atomic layer deposition (ALD) process.

Figure 7:
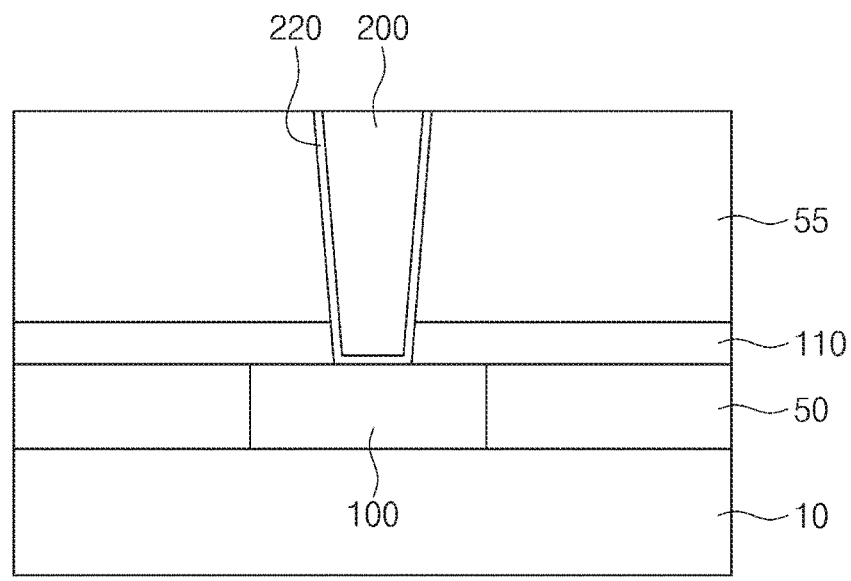

Referring to FIG. 7, a through electrode 200 may be formed in the via hole 210. The formation of the through hole 210 may include performing a metal deposition process, an electroless plating process, or an electroplating process using a seed. The through electrode 200 may be electrically connected to the first pad 100. The through electrode 200 may have slanted sidewalls with respect to the lower structure.

Figure 8:
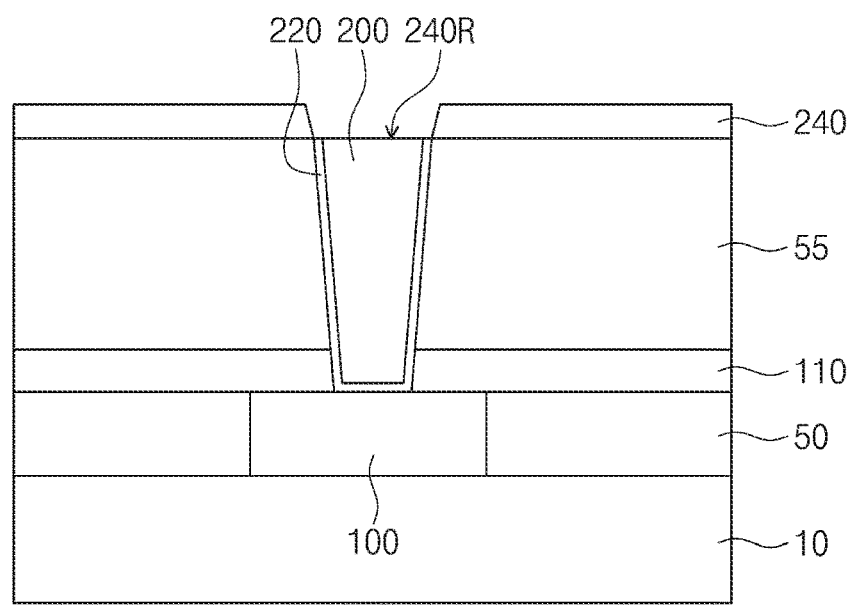

Referring to FIG. 8, an upper passivation layer 240 may be formed on the second dielectric layer 55. The formation of the upper passivation layer 240 may include performing a chemical vapor deposition process or an atomic layer deposition process. The upper passivation layer 240 may be deposited to have a uniform thickness on the second dielectric layer 55, and then an etching process may be performed to form a recess region 240R in the upper passivation layer 240. The recess region 240R may partially expose the through electrode 200. The recess region 240R may have a larger width at its upper portion and a smaller width at its lower portion.

Figure 9:
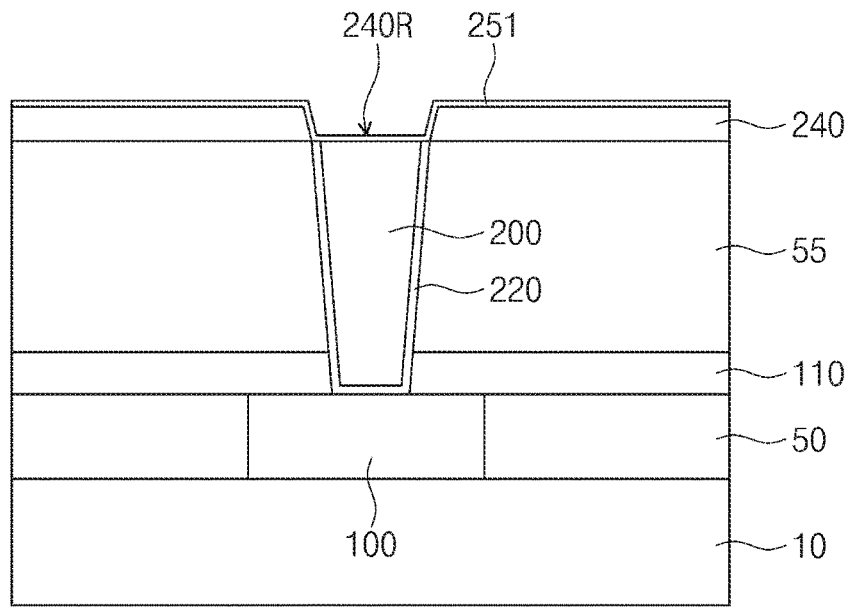

Referring to FIG. 9, a first upper barrier layer 251 may be formed on the upper passivation layer 240. The first upper barrier layer 251 may have a uniform thickness to cover an inner surface of the recess region 240R. The first upper barrier layer 251 may be formed by a physical vapor deposition (PVD) process, a chemical vapor deposition (CVD) process, or an atomic layer deposition (ALD) process.

Figure 10:
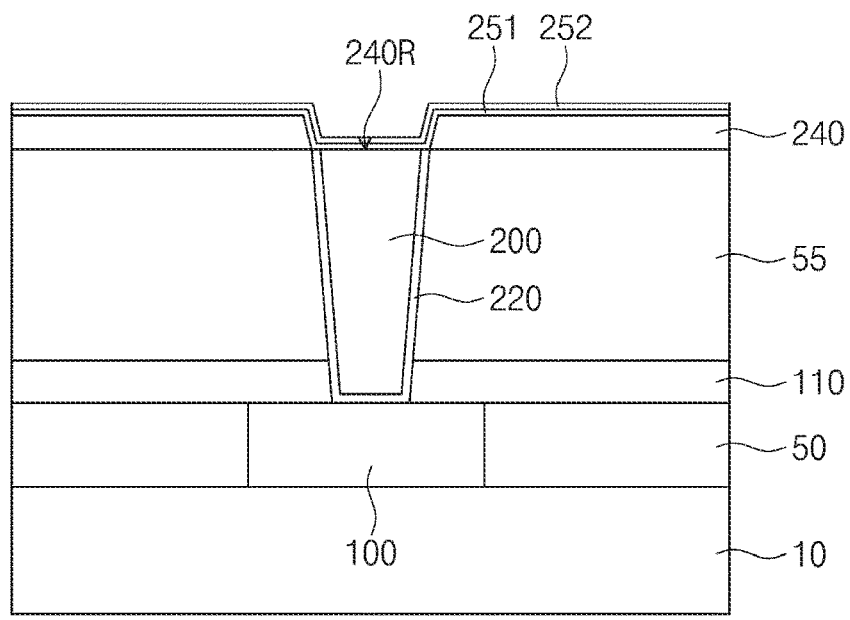

Referring to FIG. 10, a second upper barrier layer 252 may be formed on the first upper barrier layer 251. The second upper barrier layer 252 may have a uniform thickness to cover or overlap the inner surface of the recess region 240R. The second upper barrier layer 252 may be formed by a physical vapor deposition (PVD) process, a chemical vapor deposition (CVD) process, or an atomic layer deposition (ALD) process.

Figure 11:
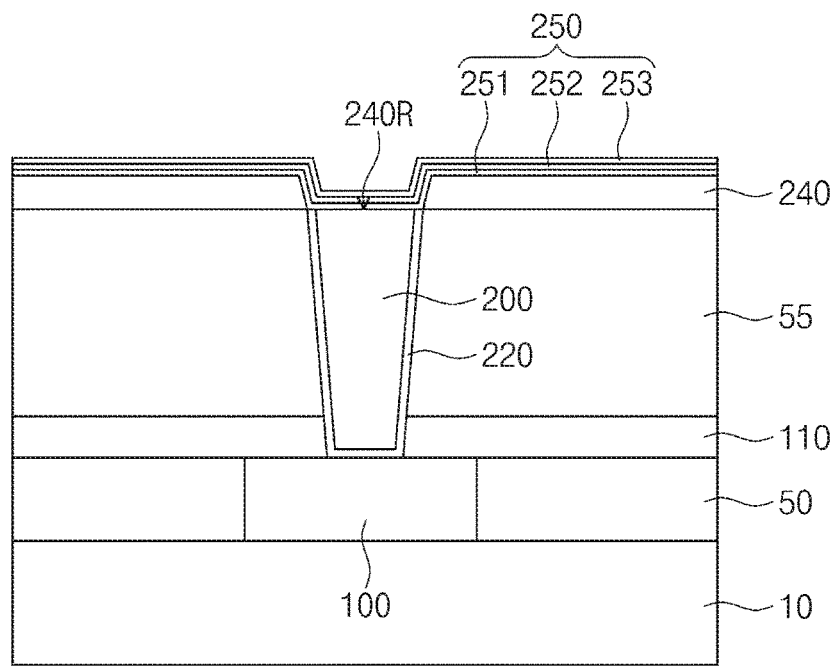

Referring to FIG. 11, a third upper barrier layer 253 may be formed on the second upper barrier layer 252. The third upper barrier layer 253 may have a uniform thickness to cover or overlap the inner surface of the recess region 240R. The third upper barrier layer 253 may be formed by a physical vapor deposition (PVD) process, a chemical vapor deposition (CVD) process, or an atomic layer deposition (ALD) process.

Figure 12:
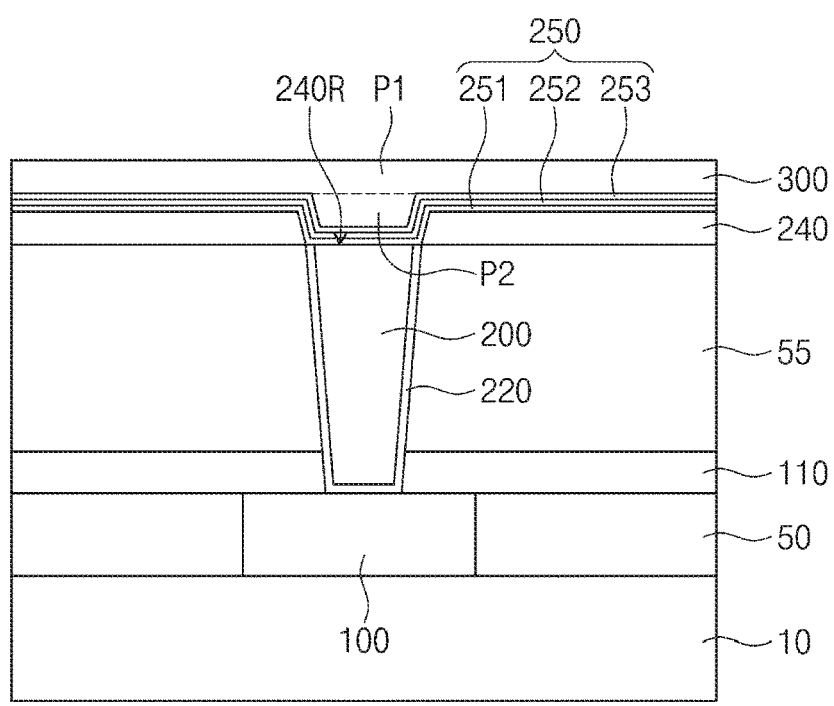

Referring to FIG. 12, a second pad 300 may be formed on the third upper barrier layer 253. An electroplating process, an electroless plating process, or a metal deposition process may be employed to deposit metal on the third upper barrier layer 253, thereby forming the second pad 300. The second pad 300 may be formed to include a first part P1 on the upper passivation layer 240 and also to include a second part P2 that extends from the first part P1 toward an inside of the upper passivation layer 240 and is connected to the through electrode 200. The second part P2 may fill an unoccupied portion of the recess region 240R. The second pad 300 may be electrically connected to the through electrode 200.

Figure 13:
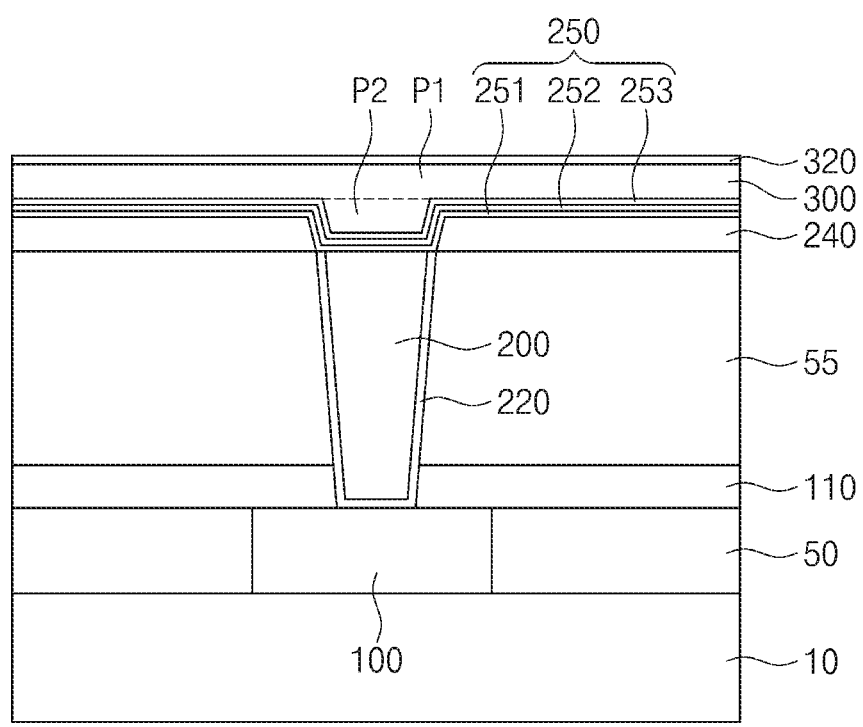

Referring to FIG. 13, a first protective layer 320 may be formed on the second pad 300. The first protective layer 320 may have a uniform thickness on the second pad 300. The first protective layer 320 may be formed by a physical vapor deposition (PVD) process, a chemical vapor deposition (CVD) process, or an atomic layer deposition (ALD) process. The first protective layer 320, the second pad 300, and the upper barrier layer 250 may be partially etched to expose opposite lateral surfaces of each of the first protective layer 320, the second pad 300, and the upper barrier layer 250 (see FIG. 1).

Figure 14:
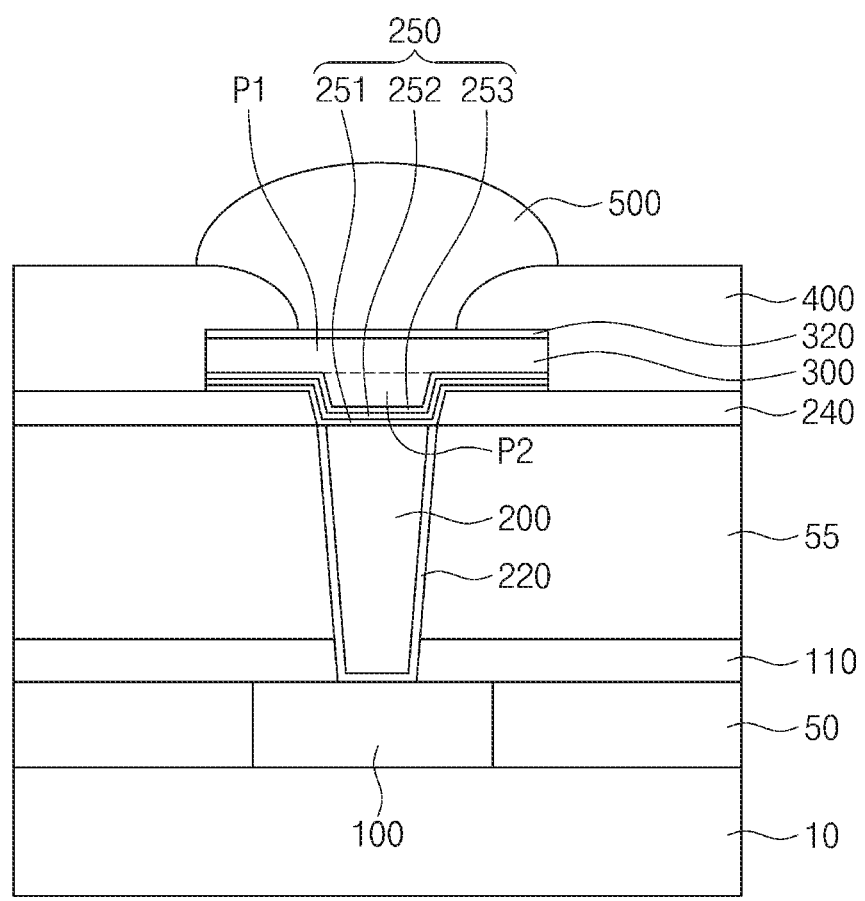
FIG. 14 illustrates a simplified cross-sectional view showing a semiconductor device according to some example embodiments of the present inventive concepts.

FIG. 14 illustrates a simplified cross-sectional view showing a semiconductor device according to some example embodiments of the present inventive concepts.

Referring to FIG. 14, a semiconductor device according to some example embodiments of the present inventive concepts may include a first pad 100, a first dielectric layer 50, a lower passivation layer 110, a lower barrier layer 220, a through electrode 200, a second dielectric layer 55, an upper passivation layer 240, an upper barrier layer 250, a second pad 300, a first protective layer 320, a second protective layer 400, and a solder ball 500.

The second protective layer 400 may be disposed on the first part P1 of the second pad 300, and may cover or overlap the opposite lateral surfaces of each of the first protective layer 320, the second pad 300, and the upper barrier layer 250.

The solder ball 500 may be disposed on the first part P1 of the second pad 300, and may penetrate the second protective layer 400 to be in contact with the first protective layer 320. The solder ball 500 may be electrically connected to the second pad 300. The solder ball 500 may include a conductive material. For example, the solder ball 500 may include a controlled collapse chip connection (C4) bump solder.

The second protective layer 400 may include silicon nitride, silicon oxide, or polyimide. For example, the second protective layer 400 may include photosensitive polyimide (PSPI).

The description with reference to FIG. 1 may also be applicable to a structure of the semiconductor device of FIG. 14, except the second protective layer 400 and the solder ball 500. Thus the description of similar elements with respect to FIG. 1 will not be repeated.

Figure 15:
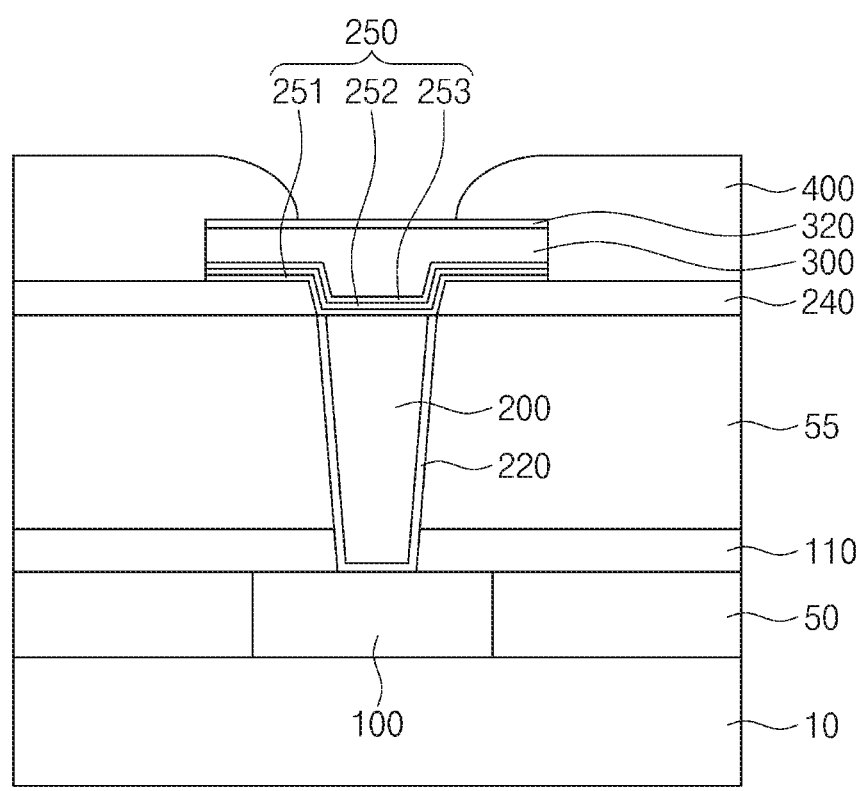
FIG. 15 illustrates a cross-sectional view showing a method of fabricating a semiconductor device according to some example embodiments of the present inventive concepts.

FIG. 15 illustrates a cross-sectional view showing a method of fabricating a semiconductor device according to some example embodiments of the present inventive concepts.

Referring to FIG. 15, the first protective layer 320, the second pad 300, and the upper barrier layer 250 may undergo an etching process to expose opposite lateral surfaces of each of the first protective layer 320, the second pad 300, and the upper barrier layer 250.

After the etching process, a second protective layer 400 may be formed to cover or overlap the opposite lateral surfaces of the first protective layer 320, the second pad 300, and the upper barrier layer 250. The second protective layer 400 may be formed by a physical vapor deposition (PVD) process, a chemical vapor deposition (CVD) process, or an atomic layer deposition (ALD) process.

Referring back to FIG. 14, a solder ball 500 may be formed on the second pad 300 and the second protective layer 400. The solder ball 500 may be formed self-aligned with the through electrode 200.

Figure 16:
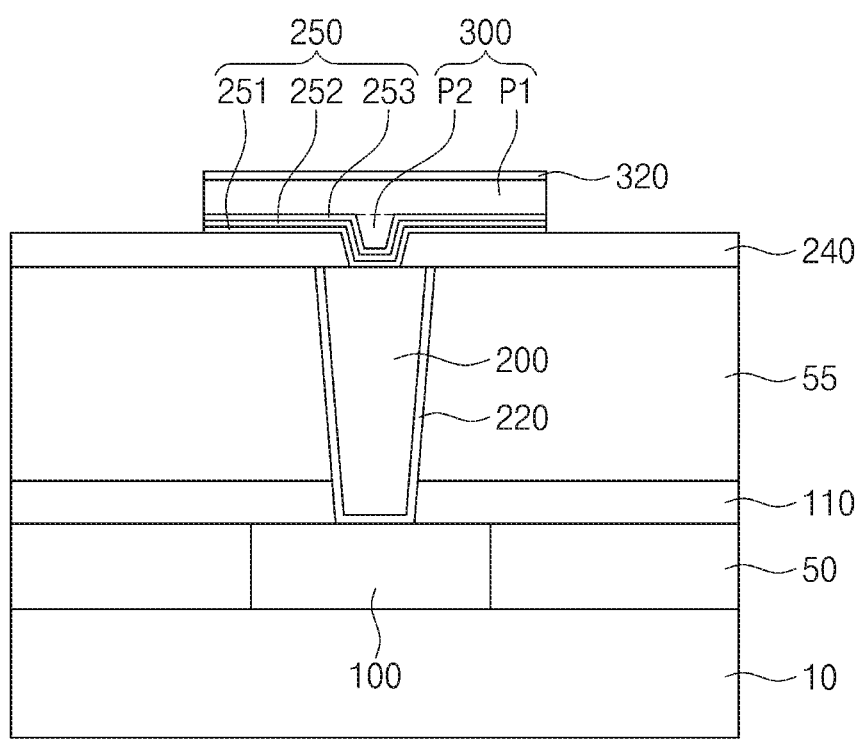
FIG. 16 illustrates a simplified cross-sectional view showing a semiconductor device according to some example embodiments of the present inventive concepts.

FIG. 16 illustrates a simplified cross-sectional view showing a semiconductor device according to some example embodiments of the present inventive concepts.

Referring to FIG. 16, the upper passivation layer 240 may cover or overlap a portion of the through electrode 200. The description with reference to FIG. 1 or 14 may also be applicable to a structure of the semiconductor device of FIG. 16, and will not be repeated here.

A method of fabricating the semiconductor device of FIG. 16 may be the same as that discussed above with reference to FIGS. 1 to 7. After the second dielectric layer 55 is formed, an upper passivation layer 240 may be formed on the second dielectric layer 55. The formation of the upper passivation layer 240 may include performing a chemical vapor deposition process or an atomic layer deposition process. The upper passivation layer 240 may be deposited to have a uniform thickness on the second dielectric layer 55, and then an etching process may be performed to form a recess region in the upper passivation layer 240. The recess region may expose a portion of the through electrode 200. The recess region may have a larger width at its upper portion and a smaller width at its lower portion.

Except the formation of the upper passivation layer 240, the description with reference to FIGS. 8 to 15 may also be applicable to steps after the formation of the recess region.

High-performance computing (HPC) may require a connection line capable of uniformly supplying a high current. Because of its high conductivity and low resistance, copper (Cu) is suitable to use as connection lines for semiconductor circuitry, but when copper is externally exposed, copper suffers from the acceleration of surface oxidation and infiltration of a surface oxidation layer thereinto, which results in easy corrosion of copper pads as a whole.

According to the present inventive concepts, a semiconductor device may be configured such that a connection line including copper and a connection pad including aluminum are used to uniformly supply a high current, and thus the semiconductor device may be employed for high-performance computing (HPC).

Furthermore, according to the present inventive concepts, a method of fabricating a semiconductor device may reduce the occurrence of voids in vias and decrease misalignment during a process for forming pads, and thus may provide a semiconductor device with high performance and reliability.

A semiconductor device according to some example embodiments of the present inventive concepts may include a copper line, an aluminum pad, and a recess region that is formed in a passivation layer, such that pad misalignment may be reduced and the occurrence of voids in vias may be decreased. Therefore, a semiconductor device with high performance and reliability may be fabricated at high yield, and thus the semiconductor device may be suitable to use for high-performance computing (HPC).

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
a first dielectric layer;
a first pad in the first dielectric layer;
a second dielectric layer on the first dielectric layer;
a through electrode that penetrates the second dielectric layer and is electrically connected to the first pad;
an upper passivation layer on the second dielectric layer;
a second pad on the upper passivation layer; and
an upper barrier layer between the upper passivation layer and the second pad,
wherein the first pad and the through electrode comprise a first material,
wherein the second pad comprises a second material different from the first material of the first pad and the through electrode, and
wherein the second pad comprises:
a first part on the upper passivation layer; and
a second part that extends from the first part into the upper passivation layer and is electrically connected to the through electrode,
wherein the upper barrier layer is between the upper passivation layer and a bottom surface of the first part of the second pad, and
wherein the upper barrier layer extends from the upper passivation layer to a lateral surface of the second part of the second pad and from the through electrode to a bottom surface of the second part of the second pad.

2. The semiconductor device of claim 1, further comprising:
a lower barrier layer between the through electrode and the second dielectric layer.

3. The semiconductor device of claim 1, further comprising:
a first protective layer on a top surface of the first part of the second pad.

4. The semiconductor device of claim 1, further comprising:
a lower passivation layer between the first dielectric layer and the second dielectric layer,
wherein the through electrode penetrates the lower passivation layer and is electrically connected to the first pad.

5. The semiconductor device of claim 1, wherein the upper barrier layer comprises:
a first upper barrier layer adjacent to the upper passivation layer;
a second upper barrier layer on the first upper barrier layer; and
a third upper barrier layer adjacent to the second pad.

6. The semiconductor device of claim 5, further comprising:
a first protective layer on the third upper barrier layer and the first part of the second pad,
wherein the first protective layer and the third upper barrier layer comprise a third material that is different from the first material and the second material.

7. The semiconductor device of claim 1, further comprising:
a second protective layer that is on the first part of the second pad and overlaps the upper passivation layer and opposite lateral surfaces of the second pad.

8. The semiconductor device of claim 1, further comprising:
a solder ball on the first part of the second pad.

9. The semiconductor device of claim 1, wherein the first material of the first pad and the through electrode comprises copper (Cu).

10. The semiconductor device of claim 1, wherein the second material of the second pad comprises aluminum (Al).

11. The semiconductor device of claim 1, wherein a width of an upper portion of the through electrode adjacent the upper barrier layer is greater than a width of a lower portion of the through electrode adjacent the first pad.

12. A semiconductor device, comprising:
a first dielectric layer;
a first pad in the first dielectric layer;
a second dielectric layer on the first dielectric layer;
a through electrode that penetrates the second dielectric layer and is electrically connected to the first pad;
an upper passivation layer on the second dielectric layer;
a second pad on the upper passivation layer;
an upper barrier layer between the upper passivation layer and the second pad;
a solder ball on the second pad;
a first protective layer between the solder ball and the second pad; and
a second protective layer on the first protective layer, the second protective layer covering lateral surfaces of each of the first protective layer, the second pad, and the upper barrier layer,
wherein the solder ball penetrates the second protective layer to contact a portion of the first protective layer, and
wherein the second protective layer comprises curved inner surfaces that contact the solder ball.

13. The semiconductor device of claim 12, wherein a width of an upper portion of the through electrode adjacent the upper barrier layer is greater than a width of a lower portion of the through electrode adjacent the first pad.

14. A semiconductor device, comprising:
a first dielectric layer;
a first pad in the first dielectric layer, the first pad comprising a first material;
a second dielectric layer on the first dielectric layer;
a through electrode that penetrates the second dielectric layer and is electrically connected to the first pad, the through electrode comprising the first material;
an upper passivation layer on the second dielectric layer;
a second pad on the upper passivation layer, wherein the second pad comprises a second material different from the first material of the first pad and the through electrode, and wherein the second pad comprises
a first part on the upper passivation layer, and
a second part that extends from the first part into the upper passivation layer;
an upper barrier layer between the upper passivation layer and the second pad, wherein the upper barrier layer comprises
a first upper barrier layer adjacent to the upper passivation layer,
a second upper barrier layer on the first upper barrier layer, and
a third upper barrier layer adjacent to the second part of the second pad; and
a first protective layer on the second pad,
wherein the first protective layer and the third upper barrier layer comprise a metal nitride that is different from the first material and the second material.

15. The semiconductor device of claim 14,
wherein the first material of the first pad and the through electrode comprises copper (Cu), and
wherein the second material of the second pad comprises aluminum (Al).

* * * * *